(12) United States Patent
Chun et al.

(10) Patent No.: US 6,684,490 B2
(45) Date of Patent: Feb. 3, 2004

(54) NOZZLE ROTATING APPARATUS OF MODULE HEAD IN SURFACE MOUNTING DEVICE

(75) Inventors: Jang Sung Chun, Seoul (KR); Do Hyun Kim, Kyungki-do (KR); Ji Hyun Hwang, Kyungki-do (KR)

(73) Assignee: Mirae Corporation, Choongchungnam-do (KR)

( * ) Notice: Subject to any disclaimer, the term of this patent is extended or adjusted under 35 U.S.C. 154(b) by 330 days.

(21) Appl. No.: 09/761,855

(22) Filed: Jan. 18, 2001

(65) Prior Publication Data

US 2001/0042303 A1 Nov. 22, 2001

(30) Foreign Application Priority Data

May 20, 2000 (KR) ........................................ 2000-27234

(51) Int. Cl.[7] .................................................. H05K 3/30
(52) U.S. Cl. .......................................... 29/740; 29/743
(58) Field of Search .......................... 29/740, 743, 834, 29/DIG. 44, 741; 414/737, 752

(56) References Cited

U.S. PATENT DOCUMENTS

| | | | | |
|---|---|---|---|---|
| 4,322,838 A | * | 3/1982 | Neumann | ................. 369/44.11 |
| 4,480,780 A | * | 11/1984 | Claeskens et al. | ............. 29/743 |
| 4,644,642 A | * | 2/1987 | Wardenaar et al. | ............ 29/834 |
| 4,860,438 A | * | 8/1989 | Chen | ............................ 29/740 |
| 4,937,510 A | * | 6/1990 | Konno et al. | ................ 318/562 |
| 5,160,181 A | * | 11/1992 | Lykam et al. | ............... 294/64.1 |
| 5,377,405 A | | 1/1995 | Sakurai et al. | |
| 5,579,572 A | | 12/1996 | Kashiwagi et al. | |
| 5,768,765 A | * | 6/1998 | Fujioka et al. | ................. 29/740 |
| 5,850,683 A | * | 12/1998 | Okazaki et al. | ................ 29/740 |
| 6,070,318 A | * | 6/2000 | Baker et al. | ................... 29/740 |
| 6,446,331 B1 | * | 9/2002 | Horigome | .................... 29/832 |

* cited by examiner

*Primary Examiner*—Carl S. Miller
(74) *Attorney, Agent, or Firm*—Birch, Stewart, Kolasch & Birch, LLP

(57) ABSTRACT

A nozzle rotating apparatus of a module head of a surface mounting device is capable of correcting an error occurring when a nozzle picks an electronic component and places it on a printed circuit board. The nozzle rotating apparatus of a module head of a surface mounting device for picking up an electronic component and placing it at a predetermined position, includes: a head movable in a predetermined direction along an upper portion of a substrate and having at least one shaft; a driving means for driving the head; a nozzle mounted at a lower predetermined portion of the head to pick up and place the electronic component; pinions installed at the outer periphery of the shaft installed at a predetermined portion of the head; a rack engaged with the pinions; and a driving force transmitting means for moving the rack to a predetermined direction.

5 Claims, 5 Drawing Sheets

NOZZLE ROTATING APPARATUS OF MODULE HEAD IN SURFACE MOUNTING DEVICE

BACKGROUND OF THE INVENTION

1. Field of the Invention

The present invention relates to a nozzle rotating apparatus of a module head of a surface mounting device, and more particularly to a nozzle rotating apparatus of a module head of a surface mounting device which is capable of correcting an error possibly occurring when a nozzle picks up an electronic component and places it on a printed circuit board.

2. Description of the Background Art

FIG. 1 is a plan view of a module head of a surface mounting device adopting a nozzle rotating apparatus in accordance with a conventional art, and FIG. 2 is a side view of the module head of FIG. 1.

Conventionally, as shown in FIGS. 1 and 2, a module head of a surface mounting device employing a nozzle rotating apparatus roughly includes a head 10 and a nozzle rotating apparatus 15.

The head 10 includes a shaft 11, a vertical movement unit 12 connected with the shaft 11 and an air opening and closing unit 13. The nozzle rotating apparatus 15 includes a rotatable motor 1a and a plurality of timing belts 1b.

A nozzle 11a is installed at the other side of the shaft 11. That is, the nozzle 11a is assembled at the other side of the shaft 11 installed penetrating the inner side of the vertical movement unit 12.

A guide pin 11b is disposed to prevent the shaft 11 from rotating rightward and leftward when the shaft 11 is moved vertically.

The shaft 11 is rotatable in a vertical direction by the vertical movement unit 12 and picks up an electronic component (not shown) when the nozzle 11a connected with one side of the shaft 11 is moved downwardly by the vertical movement unit 12.

The nozzle 11a picks up or places the electronic component according to operation of flowing in and flowing out of air which is supplied from the air opening and closing unit 13. When the nozzle 11a picks up the electronic component, it moves the electronic component to a vision unit (not shown) to thereby sense a picking position of the electronic component and discriminate whether there is an position error. In case that the nozzle 11a fails to pick up the electronic component accurately, the nozzle 11a needs to be rotated minutely and precisely.

The nozzle rotating apparatus 15 transmits the rotating force generated by the rotatable motor la to the plurality of timing belts 1b assembled at the rotational centering shaft 1c, and the timing belts 1b transmits the rotating force generated by the rotatable motor 1a to gears (not shown) combined with each engated shaft 11. Then, as the gears installed at each shaft 11 are rotated upon receiving the rotating force through the timing belt 1b, the shaft 11 is rotated, and according to the rotation of the shaft 11, the nozzle 11a is rotated.

However, the conventional nozzle rotating apparatus has disadvantages in that, since it employs the timing belt, when the timing belt is used for a long time, it is abraded. Abrasion of the timing belt causes an error between gears, leading to an occurrence of a backlash. Then, the position correction of the electronic component is not made accurately, and the durability of the nozzle rotating apparatus is shortened.

SUMMARY OF THE INVENTION

Therefore, an object of the present invention is to provide a nozzle rotating apparatus of a module head of a surface mounting device by which in case that a module head erroneously picks up a component, a shaft is minutely rotated to correct an error of a nozzle position, to thereby pick up the component accurately.

Another object of the present invention is to provide a nozzle rotating apparatus of a module head of a surface mounting device by which a backlash is prevented from occurring when an error of a nozzle position is corrected and a linear motor, a rack and a pinion are easily assembled.

To achieve these and other advantages and in accordance with the purpose of the present invention, as embodied and broadly described herein, there is provided a nozzle rotating apparatus of a module head of a surface mounting device for picking up an electronic component and placing it at a predetermined position, including: a head movable in a predetermined direction along an upper portion of a substrate and having at least one shaft; a driving means for driving the head; a nozzle mounted at a lower predetermined portion of the head to pick up and place the electronic component; pinions installed at the outer periphery of the shaft installed at a predetermined portion of the head; a rack engaged with the pinions; and a driving force transmitting means for moving the rack to a predetermined direction.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
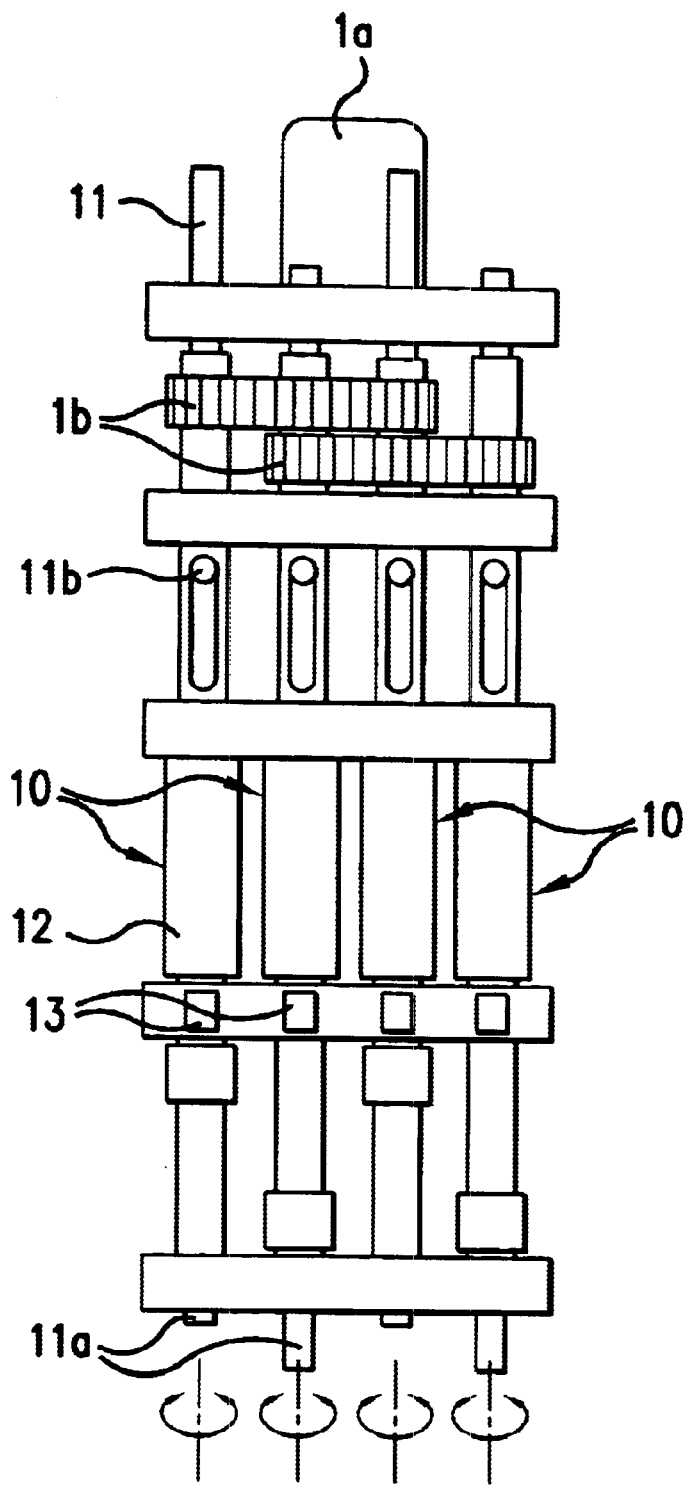
FIG. 1 is a plan view of a module head of a surface mounting device adopting a nozzle rotating apparatus in accordance with a conventional art.
Figure 2:
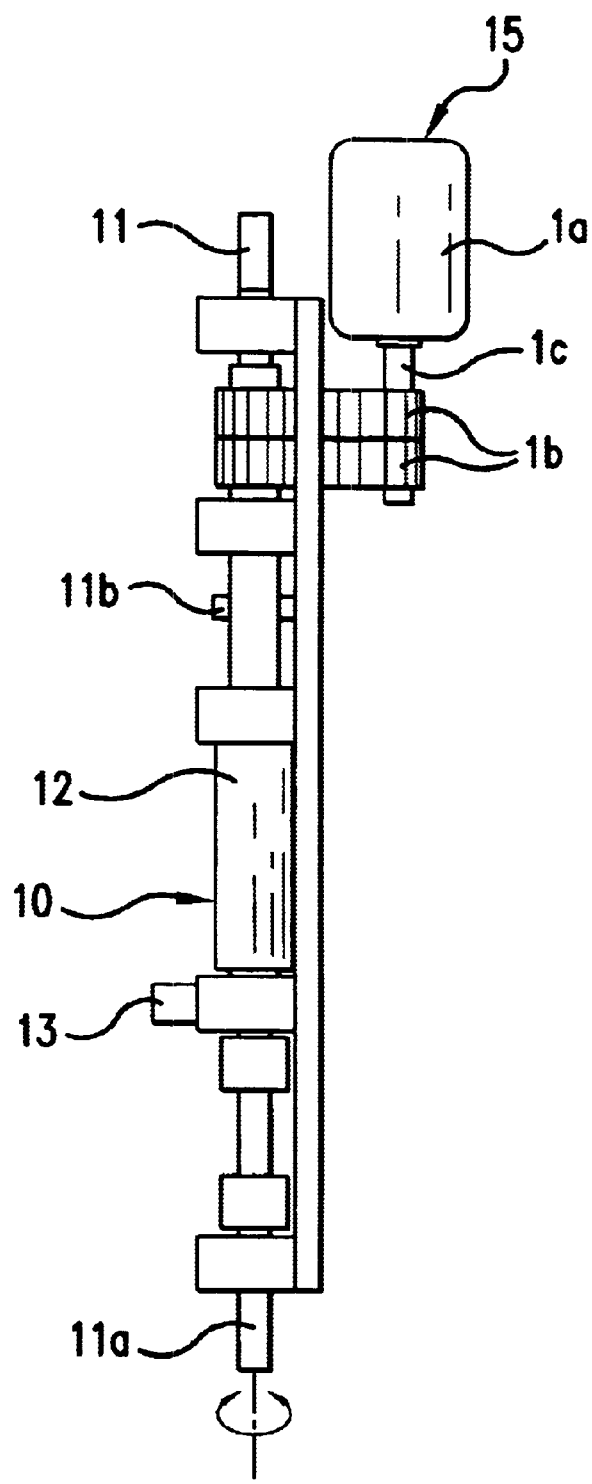
FIG. 2 is a side view of the module head of FIG. 1 in accordance with the conventional art.
Figure 3:
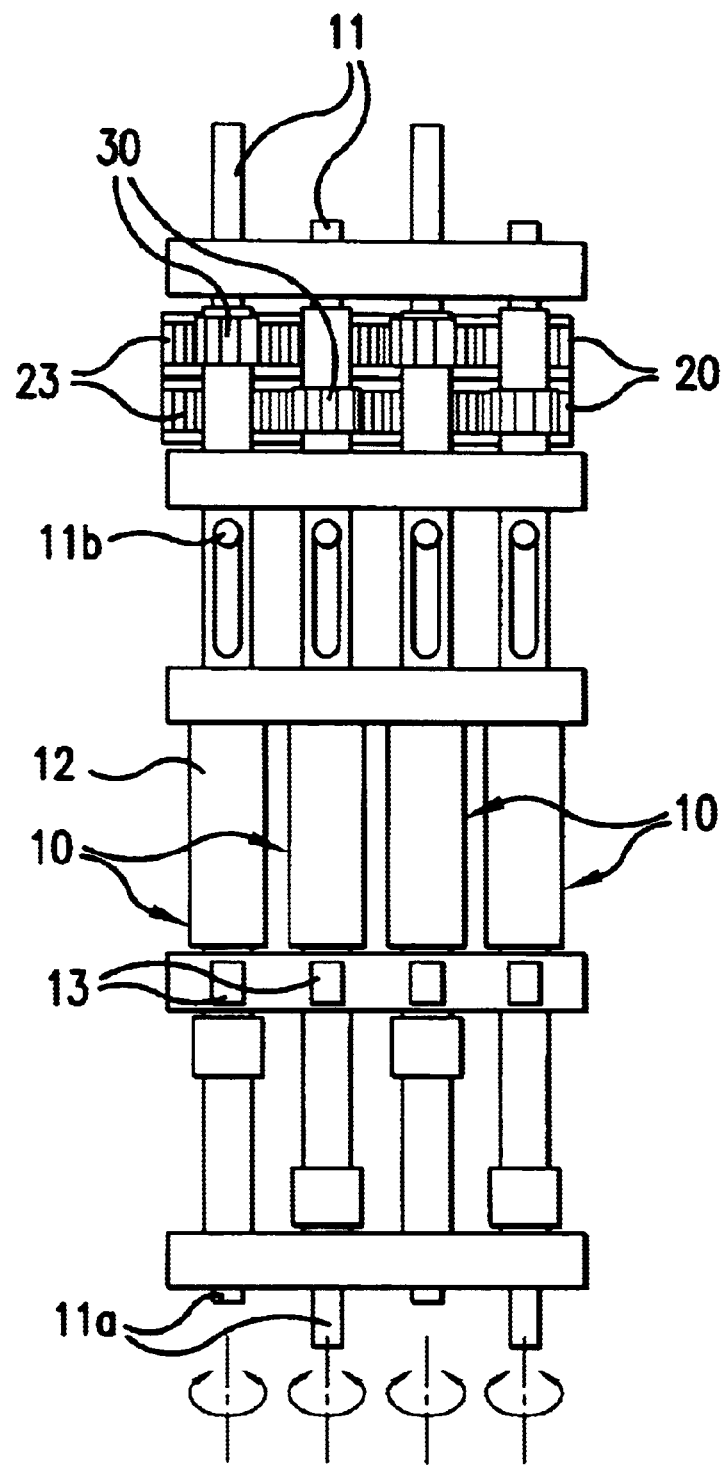
FIG. 3 is a plan view of a module head of a surface mounting device adopting a nozzle rotating apparatus in accordance with the present invention.
Figure 4:
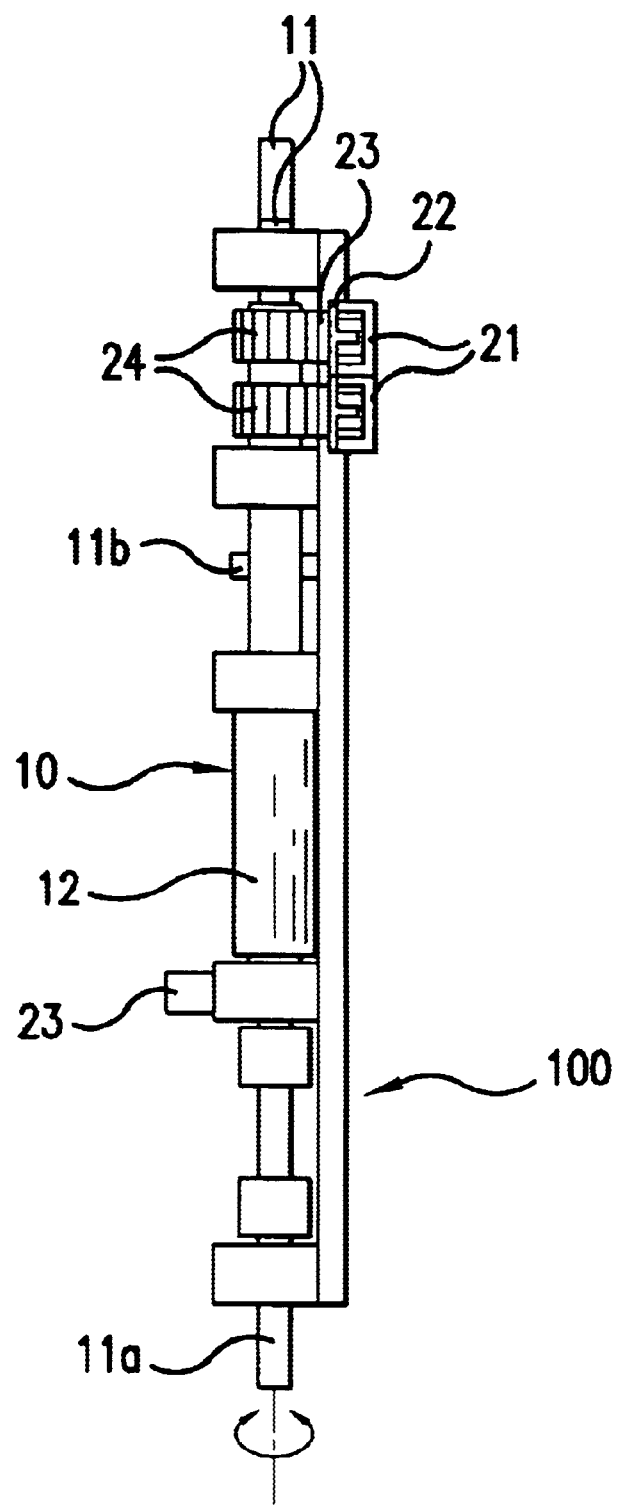
FIG. 4 is a side view of the module head of FIG. 1 in accordance with the present invention.
Figure 5:
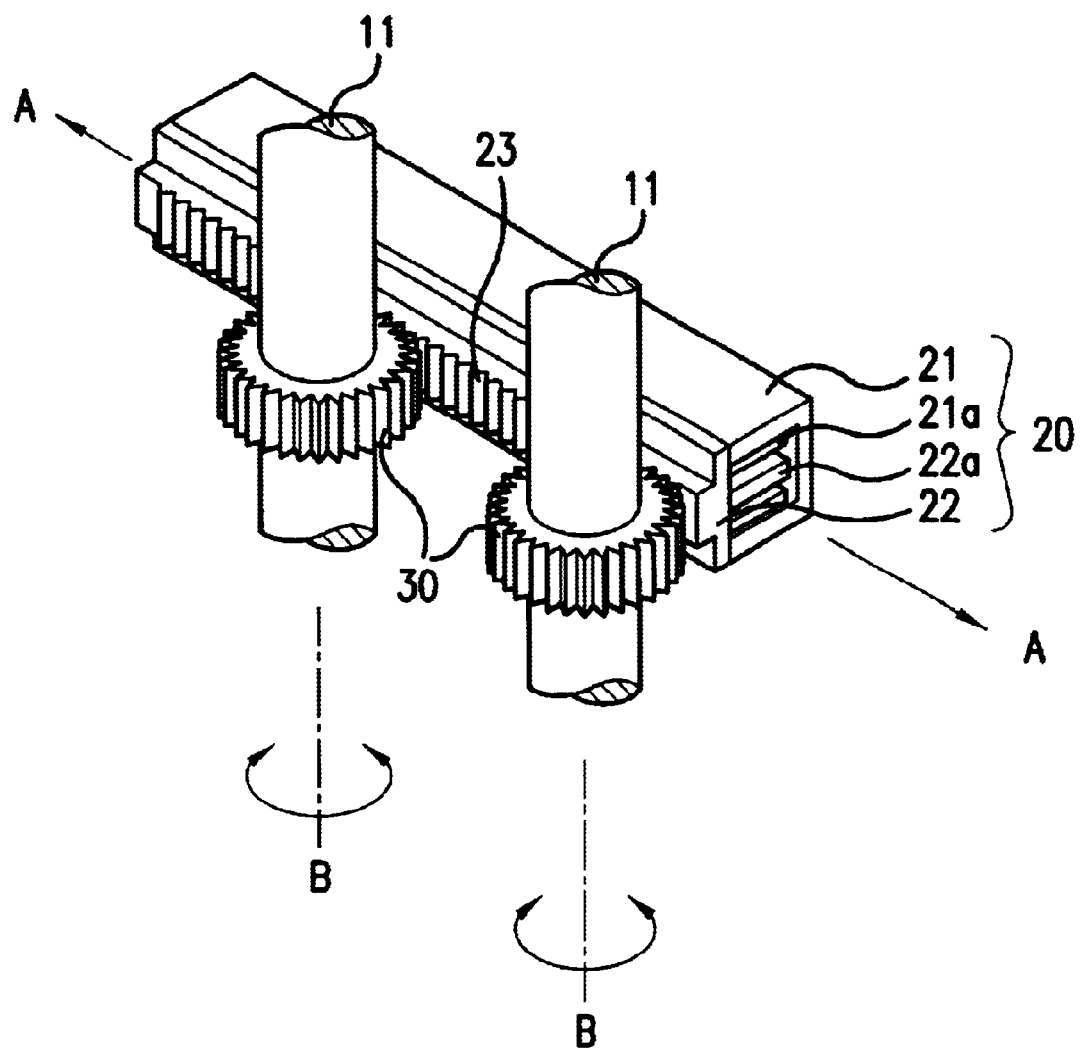
FIG. 5 is a perspective view of the nozzle rotating apparatus, a major part in accordance with the present invention.

FIG. 3 is a plan view of a module head of a surface mounting device adopting a nozzle rotating apparatus in accordance with the present invention, FIG. 4 is a side view of the module head of FIG. 1 in accordance with the present invention, and FIG. 5 is a perspective view of the nozzle rotating apparatus, a major part in accordance with the present invention.

As shown in the drawings, referring to a head 10 adopted to the present invention, a plurality of shafts 11 are installed at a predetermined portion at the inner side of the head 10, and a plurality of nozzles 11a are installed at a predetermined portion at the lower side of the shafts 11.

At a central portion of the head 10, a vertical movement unit 12 is installed to be movable to a predetermined position to pick up an electronic component (not shown).

The vertical movement unit 12 is a cylindrical linear motor (not shown), which includes a stator and a rotor. The shafts 11 are fixedly assembled at the rotor assembled in the inner side of the stator.

When the cylindrical linear motor is moved upwardly and downwardly, the shafts 11 assembled at the rotor is moved vertically, and at this time, the nozzle 11a assembled at the other end of the shafts 11 picks up the electronic component to move it to a predetermined position and place it.

In order for the nozzle 11a to pick up and place the electronic component, an air opening and closing unit 13 is required to open and close supplying of air. The air opening and closing unit 13 is installed at a lower portion of the vertical movement unit 12.

The air opening and closing unit 13 is constructed in a manner that the nozzle can suck and discharge air. Accordingly, as the nozzle 11a sucks air, it picks up the electronic component, while, as the nozzle 11a discharges air, it places the electronic component.

When the nozzle 11a picks up the electronic component, it moves the electronic component to a vision unit (not shown) to check whether the electronic component has been accurately picked up. In case that the electronic component has been accurately picked up by the nozzle, it is placed, while, in case that the electronic component has not been accurately picked up, the shafts 11 are minutely rotated to correct the error. As shown in FIGS. 3 through 5, the error correction is performed by the nozzle rotating apparatus.

The nozzle rotating apparatus is installed at an upper predetermined portion of the head 10. Pinions 30 are disposed at an outer periphery of the shafts 11 disposed at the inner side of the head 10. The pinions 30 are engaged with the rack 23 which is disposed at one side of the linear motor 20. The pinions 30 are corresponded in number to the shafts 11.

As shown in FIG. 5, the linear motor 20 consists of a stator 21 and a rotor 22. A plurality of permanent magnets 21a are installed at the inner side of the stator 21, and a plurality of coil blocks 22a are installed at the inner predetermined portion of the rotor 22. The rack 23 is disposed in the lengthy direction at an outer predetermined portion of the rotor 22.

When the linear motor 20 is driven, the rack 23 is moved to a predetermined direction, according to which the pinions 30 are rotated. Then, the shafts 11 combined with the pinions 30 are rotated, according to which the nozzle 11a disposed at the other end of the shafts 11 is minutely rotated. In other words, the nozzle 11a is minutely rotated by the guide pin 11b for guiding in a vertical direction so that the nozzle 11a is not horizontally rotated when the shafts 11 are vertically moved. That is, in case where the nozzle 11a erroneously picks up a component, it is corrected.

As for the linear motor 20, when current flows to the coil block 22a, magnetic field is generated at the permanent magnet 21a installed at the stator 21 in the direction perpendicular to the flowing of the current, so that the rotor 22 is maintained to face the stator 21, performing the linear movement.

In the above descriptions, the moving coil type linear motor 20 was taken as an example. In this respect, however, a moving magnet-type linear motor can be applicable within the scope of the present invention.

The nozzle rotating apparatus of the module head of the surface mounting device has such advantages that since the rotation of the nozzle can be precisely controlled by using the rack and the pinions, a backlash caused due to abrasion of the nozzle can be removed, and as the rack is integrally installed with the rotor at one side of the rotor, the nozzle rotating apparatus can be easily assembled.

As so far described, according to the nozzle rotating apparatus of the module head of the surface mounting device of the present invention, the nozzle can be rotated to correct a position to pick up an electronic component, the back lash due to abrasion of the electronic component can be prevented from occurring and the nozzle rotating apparatus can be easily assembled at the module head.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A nozzle rotating apparatus of a module head of a surface mounting device for picking up an electronic component and placing it at a predetermined position, comprising:
   a head movable in a predetermined direction along an upper portion of a substrate and having at least one shaft;
   a driving means for driving the head;
   a nozzle mounted at a lower predetermined portion of the head to pick up and place the electronic component;
   pinions mounted at the outer periphery of the shaft;
   a rack engaged with the pinions and installed at a predetermined portion of a driving force transmitting means; and
   a driving force transmitting means for moving the rack to a predetermined direction.

2. The apparatus according to claim 1 wherein the driving force transmitting means is a linear motor.

3. A nozzle rotating apparatus of a module head of a surface mounting device, comprising:
   a head having a nozzle;
   a driving means for driving the head;
   a pair of pinions mounted at the shaft;
   a rack engaged with the pinions; and
   a linear motor having a stator and a rotor connected to the rack for moving the rack to a predetermined direction.

4. The nozzle rotating apparatus as defined in claim 3, wherein each pinion is
configured to move along a linear movement of the rack.

5. The nozzle rotating apparatus as defined in claim 3, wherein the pinion has the same number as the shaft mounted in an inner side of the head.

* * * * *